United States Patent [19]

Berney

[11] Patent Number: 5,523,618
[45] Date of Patent: Jun. 4, 1996

[54] ELECTRONIC INTEGRATED CIRCUIT LABEL

[75] Inventor: Jean Claude Berney, Les Charbonnières, Switzerland

[73] Assignee: Gay Freres Vente et Exportation, Geneva, Switzerland

[21] Appl. No.: 185,844

[22] PCT Filed: May 24, 1993

[86] PCT No.: PCT/CH93/00133

§ 371 Date: Jan. 25, 1994

§ 102(e) Date: Jan. 25, 1994

[87] PCT Pub. No.: WO93/24902

PCT Pub. Date: Dec. 9, 1993

[30] Foreign Application Priority Data

May 25, 1992 [CH] Switzerland .................. 01669/92

[51] Int. Cl.⁶ .................. H01L 23/02; G06K 5/00; H01B 17/16
[52] U.S. Cl. .................. 257/679; 257/678; 257/738; 235/380; 235/492; 235/488; 174/52.4; 174/260
[58] Field of Search .................. 257/678, 679, 257/701, 734, 738, 787, 708, 709; 235/380, 492, 488; 174/52.4, 260

[56] References Cited

U.S. PATENT DOCUMENTS 4,004,133  1/1977  Hannan et al. .................. 235/61.7
4,649,418  3/1987  Uden .................. 357/80

FOREIGN PATENT DOCUMENTS 0367311  5/1990  European Pat. Off. .
2336741  7/1977  France .
2558291  7/1985  France .
3526435  1/1987  Germany .
2082804  3/1982  United Kingdom .

*Primary Examiner*—Sara W. Crane
*Assistant Examiner*—Carl Whitehead, Jr.
*Attorney, Agent, or Firm*—Walter C. Farley

[57] ABSTRACT

A miniature electronic label or tag includes a metal card, and an integrated memory circuit attached to a surface of said card. The integrated memory circuit has an outer surface facing the card, an electrically conductive region on the surface and two input/output conductors. A first conductor is electrically connected to the card and the second conductor is electrically connected to the electrically conductive region. An opening through said card adjacent said electrically conductive portion permits electrical connection to be made to the first conductor by electrical contact with said card and electrical connection to the second conductor can be made by contact with the electrically conductive region through the opening, either directly or indirectly.

12 Claims, 3 Drawing Sheets

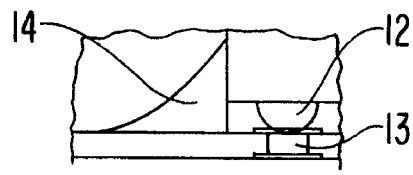
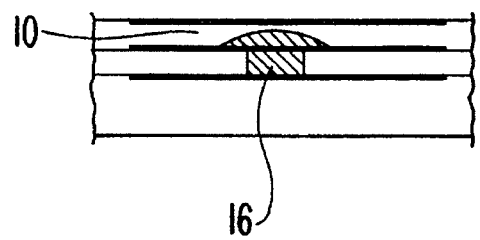
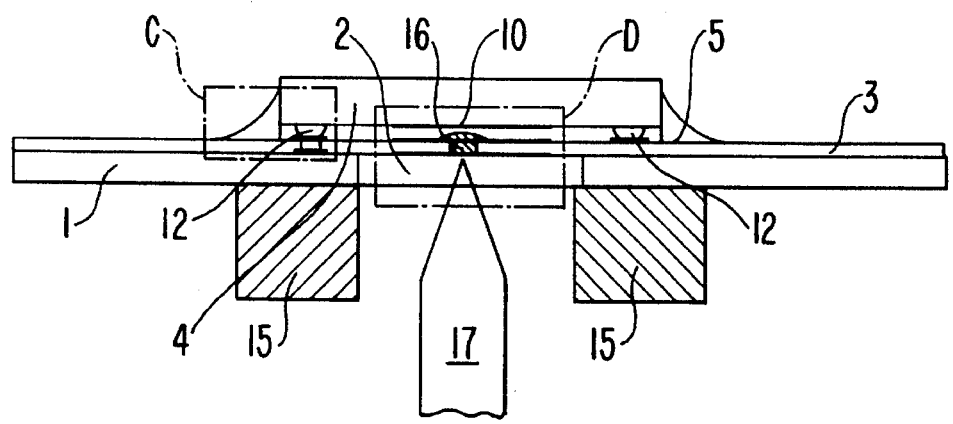
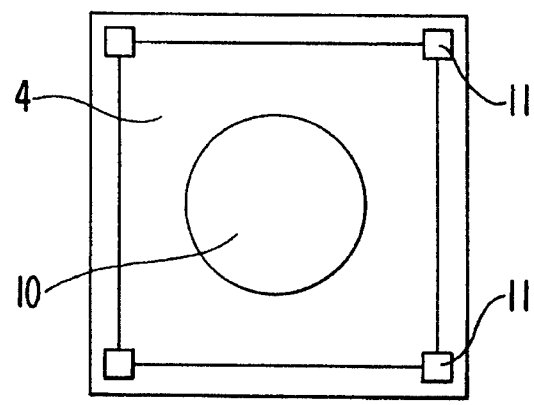

ELECTRONIC INTEGRATED CIRCUIT LABEL

FIELD OF THE INVENTION

This invention relates to the field of electronic labels in which a memory is provided with information to be read for identifying an article to which the lable is attached.

BACKGROUND OF THE INVENTION

The field of electronic labels is currently in full expansion. The systems in question comprise an electronic memory with either a read-only function (ROM), or a read-write function (RAM, EPROM, EEPROM) allowing information relating to the product to which the label is affixed to be recorded and read.

Certain of these labels are relatively large, but there is a real trend towards miniaturization, so that these labels can be discreetly accommodated in all sorts of products.

Furthermore, the current trend is to be able to read the label at a certain distance, which necessitates the incorporation of a coil for transmitting non-contact signals.

Although very miniaturized versions have already been developed, notably electronic labels for implanting in animals, or ultra-flat models which can be incorporated within a standard "credit card" format, this is not sufficient for certain applications.

SUMMARY OF THE INVENTION

This invention concerns a miniature electronic label where the coil has been replaced by a system of direct access via contacts. This electronic label, which comprises an integrated memory circuit that is electrically accessible via two tie lines or input/output conductors it comprises a metallic card which serves as a support, said card being connected electrically to the first input/output conductor or tie line, and comprising an aperture via which a contact zone connected at least indirectly to the second input/output conductor or tie line can be accessed.

BRIEF DESCRIPTION OF THE DRAWINGS

FIG. 2A is a side elevation in partial section of the embodiment of a label in accordance with FIGS. 1A and 1B showing further details of interconnections of the parts thereof; FIG. 2B is a top plan view of the label of FIG. 2A; FIGS. 2C and 2D are enlarged side elevations of portions C and D of FIG. 2A;

Description of the Preferred Embodiments

Figure 1A:
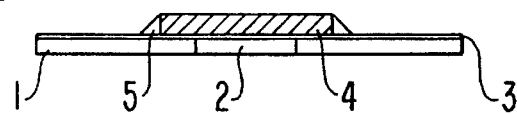
FIGS. 1A and 1B are, respectively, sectional side elevation and top plan views; of a first general embodiment of an electronic label according to the invention.
Figure 1B:
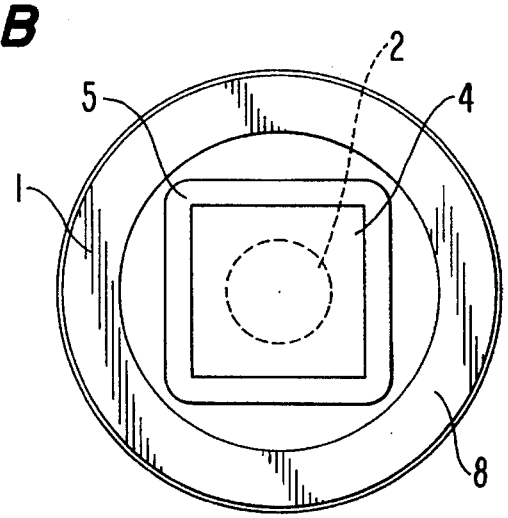

FIGS. 1A and 1B show a circular metallic card 1 with hole a 2 at the center thereof. A thin interconnection interface 3 of the printed circuit board type is mounted on said card. Finally, an integrated memory circuit 4 is in turn mounted on the printed circuit 3 and fixed by means of an adhesive thread 5. FIGS. 2A–2D show the interconnections between theses different elements in greater detail.

Figure 3:
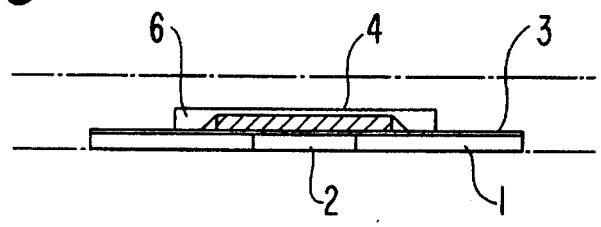
FIGS. 3 and 4 are side elevations of labels assembled with objects.
Figure 4:
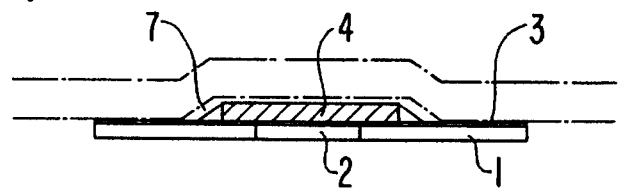

The electronic label thus formed can be mounted in a machined housing 6 or preformed housing 7 as shown in FIGS. 3 and 4, in any object for which the electronic label is intended. This label is particularly well suited for use on metallic objects where it can be ensured that the housing has a certain rigidity. Furthermore, the metallic card can be made of the same metal as that of the housing in which it is to be affixed. Thus, if housings 6 and 7 are contrived in objects made of gold, the card 1 will also be made of gold. This is significant; precious materials such as gold or platinum are chosen because of the very strict regulations for obtaining official stamps. Moreover, bearing in mind the very small dimensions which can be achieved, a typical example being a diameter of 5 mm and a height of 0.5 mm, this label is particularly discreet.

To mount the electronic label in housings 6, 7 as shown in FIGS. 3 and 4, a pre-adhered zone 8 can be provided on interface 3, allowing the label to be affixed within its housing by means of thermal bonding.

FIGS. 2A–2D show some details of the possible interconnections between the different elements shown in FIGS. 1A and 1B. The metallic card 1 with its central hole 2, the interconnection interface 3 and the silicon substrate 4 of the integrated memory circuit can be recognized.

The integrated circuit 4 comprises two input/output conductors, the first connected to a central metallized zone 10, and the second connected to four peripheral metallized zones 11. It can thus be said that these two conductors are coaxial. The four peripheral zones 11 comprise four bumps 12 facing opposite metallized zones of the printed circuit 3 which are galvanically connected to the metallic base card. Thus the integrated circuit 4 can be fixed to the interconnection interface 3 by means of thermocompression.

The metallic card 1 is thus galvanically connected to the first conductor and contact can be established with this first conductor by means, for example, of a circular contact 15 made of conductive rubber, pressed against the metallic card.

The adhesive thread 14, which is of non-conductive adhesive, serves solely to ensure the imperviousness and the solidity of the assembly.

Furthermore, the interconnection interface 3 comprises at its center a contact element 16 facing opposite the central metallized zone of the integrated circuit 10. By using a connection interface 3 made of CAPTON™, a polymide insulator foil material with a certain flexibility, contact can be established with the metallized zone 10, and from there with the second conductor by inserting a spring contact 17 into the hole of the metallic card 2.

To summarize, the input/output conductors of the integrated circuit can be accessed using the system of coaxial contacts 15, 17 mounted in an appropriate second probe.

Other embodiments are of course possible.

The interconnection interface 3 could be omitted, for example, and the integrated circuit 4 mounted directly on the card 1 by means of thermocompression. In this case, the central metallized zone 10 could be accessed directly with contact 17. However, the integrated circuit would then be in the open air, something which can only be contemplated in certain applications.

Furthermore, it is known that in the majority of integrated circuits, the substrate can be connected to one of the input/output conductors conductor. Contact between this conductor and the card can therefore be obtained directly by laying a thread 14 of conductive adhesive and by removing the connection via the metallizations 11, the bumps 12 and the zones 13.

The other elements of the electronic label according to the invention, particularly those relating to the characteristics of the actual memory, are known to the person skilled in the art and are therefore not described in detail.

Figure 5:
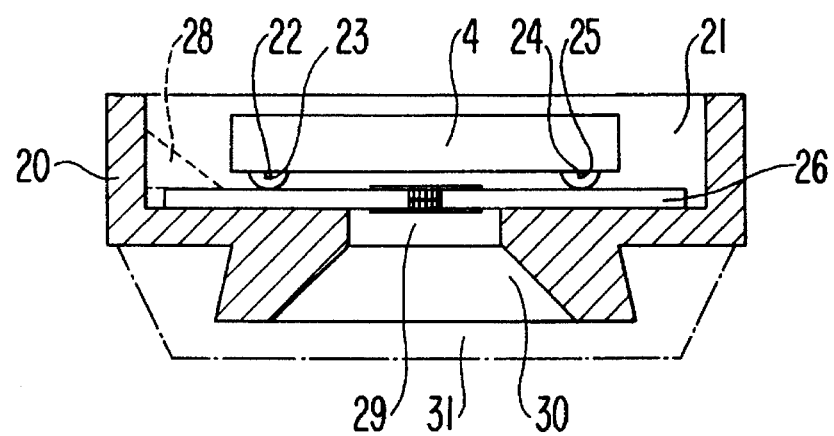
FIG. 5 is a side elevation of a further embodiment of a label according to the invention.
Figure 6:
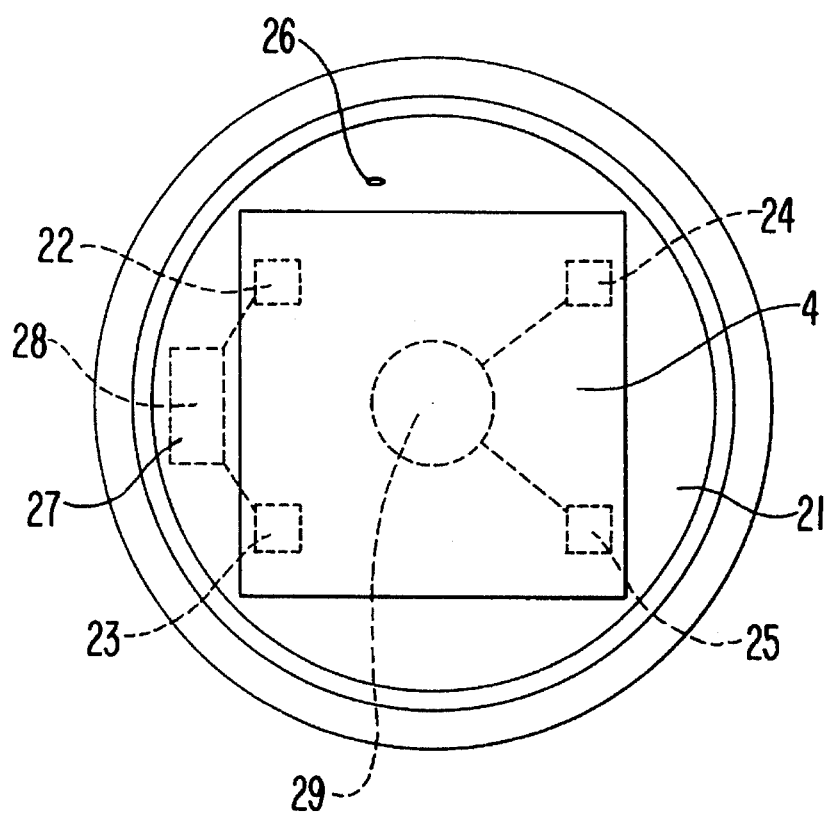
FIG. 6 is a top plan view of the embodiment of FIG. 5.

FIGS. 5 and 6 show another embodiment of the label according to the invention. In this case, the metallic card 20 is a card of a shape obtained by molding, for example. The edge of this card is bent at 90 degrees so as to form a housing 21 in which the integrated circuit 4 is mounted in a similar manner as that used in FIG. 2. However, the integrated circuit does not comprise any central metallization, but four pads located at its periphery, the first two 22, 23 being connected to the first conductor and the last two 24, 25 to the second conductor.

Pads 22 and 23 are soldered by thermocompression onto a printed circuit 26 and connected to a contact zone 27 of this printed circuit. This contact zone can be connected by a drop of conductive adhesive 28 to the wall of the metallic card 20 which is thereby electrically connected to the first conductor.

Pads 24 and 25, also soldered by thermocompression onto the printed circuit 26, are connected to a central contact zone 29 of the printed circuit. This central contact zone is located on the two sides of the printed circuit, these two sides being connected via a metallized hole, for example. The lower portion of this contact zone 29 can thus be accessed with a point for electrical connection to the second input/output conductor.

With this particular form of the metallic card, a resin can be poured into the housing after assembling the printed circuit. By doing so, a compact, perfectly protected component can be attained.

In this example the partly conical shape of the hole 30 and the shape of the card is designed to allow the contact point to be guided. The particular shape also allows a cover 31 for protecting the contact to be attached.

I claim:

1. An electronic label comprising the combination of
   a metal card;
   an integrated memory circuit attached to a surface of said card, said integrated memory circuit having
      an outer surface facing said card,
      an electrically conductive region on said outer surface facing said card, and
      first and second input/output conductors, said first conductor being electrically connected to said card and said second conductor being electrically connected to said electrically conductive region; and
   means defining an opening through said card adjacent said electrically conductive portion, whereby electrical connection can be made to said first conductor by electrical contact with said card and electrical connection to said second conductor can be made by contact with said electrically conductive region through said opening.

2. A label according to claim 1 wherein said card includes a connection interface on said surface of said card between said card and said integrated memory circuit, said interface comprising a printed circuit board.

3. A label according to claim 2 wherein said integrated circuit includes a second peripheral electrically conductive region on said outer surface, said second region having a plurality of protruding electrically conductive bumps making contact with said interface.

4. A label according to claim 1 wherein said first input/output conductor comprises a substrate of said integrated circuit.

5. A label according to claim 4 wherein said electrical connection between said first conductor and said card comprises an electrically conductive adhesive.

6. A label according to claim 1 and further comprising a zone of adhesive on said label for attaching said label to a housing.

7. A label according to claim 6 wherein said housing comprises a metal and wherein said metal card is made of the same metal as said housing.

8. A label according to claim 1 wherein said metal card comprises wall forming a housing for said integrated circuit, and wherein said means defining an opening includes a guide surface for guiding a contact probe to said electrically conductive region.

9. A label according to claim 8 wherein said guide surface comprises a conical portion.

10. A label according to claim 8 wherein said means defining an opening comprises an extension with an inclined outer surface, and means defining a cover shaped to engage said inclined outer surface.

11. A label according to claim 8 and including a resin covering said integrated circuit in said housing.

12. A label according to claim 1 wherein said means defining an opening comprises a metal contact passing through said card and wherein said card is flexible, whereby electrical connection to said second conductor can be made by contacting said metal contact and pressing said contact against said electrically conductive region.

\* \* \* \* \*